United States Patent
Enicks et al.

(10) Patent No.: US 9,012,308 B2
(45) Date of Patent: Apr. 21, 2015

(54) INTEGRATED CIRCUIT STRUCTURES CONTAINING A STRAIN-COMPENSATED COMPOUND SEMICONDUCTOR LAYER AND METHODS AND SYSTEMS RELATED THERETO

(71) Applicant: Atmel Corporation, San Jose, CA (US)

(72) Inventors: Darwin Gene Enicks, Colorado Springs, CO (US); John Chaffee, Colorado Springs, CO (US); Damian A. Carver, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 14/016,673

(22) Filed: Sep. 3, 2013

(65) Prior Publication Data

US 2014/0001603 A1     Jan. 2, 2014

Related U.S. Application Data

(60) Division of application No. 12/901,867, filed on Oct. 11, 2010, now Pat. No. 8,530,934, which is a continuation-in-part of application No. 11/268,154, filed on Nov. 7, 2005, now abandoned.

(51) Int. Cl.
*H01L 21/20* (2006.01)
*H01L 21/36* (2006.01)
(Continued)

(52) U.S. Cl.
CPC .......... *H01L 29/165* (2013.01); *H01L 21/02381* (2013.01); *H01L 21/02529* (2013.01);
(Continued)

(58) Field of Classification Search
CPC ......... H01L 33/58; H01L 33/46; H01L 33/22; H01L 2933/0016

USPC ......................................................... 438/483
See application file for complete search history.

(56) References Cited

U.S. PATENT DOCUMENTS 4,213,781 A * 7/1980 Noreika et al. ............... 420/528
4,459,739 A   7/1984 Shepard et al.
(Continued)

FOREIGN PATENT DOCUMENTS

WO   WO2007001672 A2   1/2007
WO   WO2007001672 A3   1/2007
(Continued)

OTHER PUBLICATIONS

Enicks, D., "A Study of Process-Induced Oxygen Updiffusion in Pseudomorphic Borno-Doped Sub-50 nm SiGeC Layers Grown by LPCVD", Electrochemical and Solid-State Letters, 8(10), (2005), G286-G289.
(Continued)

*Primary Examiner* — Jarrett Stark
(74) *Attorney, Agent, or Firm* — Fish & Richardson P.C.

(57) ABSTRACT

A method for pseudomorphic growth and integration of an in-situ doped, strain-compensated metastable compound base into an electronic device, such as, for example, a SiGe NPN HBT, by substitutional placement of strain-compensating atomic species. The invention also applies to strained layers in other electronic devices such as strained SiGe, Si in MOS applications, vertical thin film transistors (VTFT), and a variety of other electronic device types. Devices formed from compound semiconductors other than SiGe, such as, for example, GaAs, InP, and AlGaAs are also amenable to beneficial processes described herein.

20 Claims, 3 Drawing Sheets

(51) Int. Cl.
*H01L 31/20* (2006.01)
*H01L 29/165* (2006.01)
*H01L 29/66* (2006.01)
*H01L 29/78* (2006.01)
*H01L 21/02* (2006.01)

(52) U.S. Cl.
CPC ..... *H01L21/02532* (2013.01); *H01L 21/02579* (2013.01); *H01L 21/0262* (2013.01); *H01L 29/66242* (2013.01); *H01L 29/7842* (2013.01)

(56) References Cited

U.S. PATENT DOCUMENTS

| | | | |
|---|---|---|---|
| 4,652,183 A | 3/1987 | Veltri et al. | |
| 4,701,423 A | 10/1987 | Szluk | |
| 4,908,325 A | 3/1990 | Berenz | |
| 5,137,838 A | 8/1992 | Ramde et al. | |
| 5,155,571 A | 10/1992 | Wang et al. | |
| 5,177,583 A | 1/1993 | Endo et al. | |
| 5,202,284 A * | 4/1993 | Kamins et al. | 117/95 |
| 5,241,214 A | 8/1993 | Herbots | |
| 5,331,659 A | 7/1994 | Ohata et al. | |
| 5,378,901 A | 1/1995 | Nii | |
| 5,466,949 A | 11/1995 | Okuno | |
| 5,569,538 A | 10/1996 | Cho | |
| 5,620,907 A | 4/1997 | Jalali-Farahani | |
| 5,661,059 A | 8/1997 | Liu et al. | |
| 5,686,350 A | 11/1997 | Lee et al. | |
| 5,804,834 A | 9/1998 | Shimoyama et al. | |
| 5,856,685 A | 1/1999 | Nakayama | |
| 5,906,708 A | 5/1999 | Robinson et al. | |
| 5,906,951 A | 5/1999 | Chu et al. | |
| 5,965,931 A | 10/1999 | Wang et al. | |
| 6,059,895 A | 5/2000 | Chu et al. | |
| 6,064,081 A | 5/2000 | Robinson et al. | |
| 6,087,683 A | 7/2000 | King et al. | |
| 6,107,647 A | 8/2000 | Matsumoto et al. | |
| 6,165,891 A | 12/2000 | Chooi et al. | |
| 6,323,108 B1 | 11/2001 | Kub et al. | |
| 6,399,970 B2 | 6/2002 | Kubo et al. | |
| 6,512,252 B1 | 1/2003 | Takagi et al. | |
| 6,521,041 B2 | 2/2003 | Wu et al. | |
| 6,531,369 B1 | 3/2003 | Ozkan et al. | |
| 6,552,375 B2 | 4/2003 | Swanson et al. | |
| 6,586,297 B1 | 7/2003 | U-Ren et al. | |
| 6,593,625 B2 | 7/2003 | Christiansen et al. | |
| 6,656,809 B2 | 12/2003 | Greenberg et al. | |
| 6,667,489 B2 | 12/2003 | Suzumura et al. | |
| 6,670,542 B2 | 12/2003 | Sakata et al. | |
| 6,670,654 B2 | 12/2003 | Lanzerotti et al. | |
| 6,680,494 B2 | 1/2004 | Gutierrez-Aitken et al. | |
| 6,709,903 B2 | 3/2004 | Christiansen et al. | |
| 6,744,079 B2 | 6/2004 | Jagannathan et al. | |
| 6,746,902 B2 | 6/2004 | Maa et al. | |
| 6,750,484 B2 | 6/2004 | Lippert et al. | |
| 6,759,694 B1 | 7/2004 | Hsu et al. | |
| 6,780,796 B2 | 8/2004 | Maa et al. | |
| 6,781,214 B1 | 8/2004 | U'Ren et al. | |
| 6,787,822 B1 | 9/2004 | Nuyen | |
| 6,841,457 B2 | 1/2005 | Bedell et al. | |
| 6,855,649 B2 | 2/2005 | Christiansen et al. | |
| 6,855,963 B1 | 2/2005 | Chu et al. | |
| 6,858,541 B2 | 2/2005 | Horning | |
| 6,876,010 B1 | 4/2005 | Fitzgerald | |
| 6,900,115 B2 | 5/2005 | Todd | |
| 6,906,400 B2 | 6/2005 | Delhougne et al. | |
| 6,927,140 B2 | 8/2005 | Soman et al. | |
| 6,936,910 B2 | 8/2005 | Ellis-Monaghan et al. | |
| 6,963,089 B2 | 11/2005 | Shi et al. | |
| 6,992,004 B1 | 1/2006 | Besser et al. | |
| 6,995,430 B2 | 2/2006 | Langdo et al. | |
| 7,074,623 B2 | 7/2006 | Lochtefeld et al. | |
| 7,091,114 B2 | 8/2006 | Ito et al. | |
| 7,227,176 B2 | 6/2007 | Wu et al. | |
| 7,273,799 B2 | 9/2007 | Todd | |
| 7,495,250 B2 | 2/2009 | Enicks | |
| 7,517,768 B2 | 4/2009 | Soman et al. | |
| 7,550,758 B2 | 6/2009 | Enicks | |
| 7,569,913 B2 | 8/2009 | Enicks | |
| 2001/0035863 A1 | 11/2001 | Kimura | |
| 2002/0008289 A1 | 1/2002 | Murota et al. | |
| 2002/0081861 A1 | 6/2002 | Robinson et al. | |
| 2002/0105015 A1 | 8/2002 | Kubo et al. | |
| 2002/0185686 A1 | 12/2002 | Christiansen et al. | |
| 2003/0040130 A1 | 2/2003 | Mayur et al. | |
| 2003/0080394 A1 | 5/2003 | Babcock et al. | |
| 2003/0082882 A1 | 5/2003 | Babcock et al. | |
| 2003/0098465 A1 | 5/2003 | Suzumura et al. | |
| 2003/0129802 A1 | 7/2003 | Lanzerotti et al. | |
| 2003/0132453 A1 | 7/2003 | Greenberg et al. | |
| 2003/0140844 A1 | 7/2003 | Maa et al. | |
| 2003/0143783 A1 | 7/2003 | Maa et al. | |
| 2003/0146448 A1 | 8/2003 | U'Ren et al. | |
| 2003/0159644 A1 | 8/2003 | Yonehara et al. | |
| 2003/0201468 A1 | 10/2003 | Christiansen et al. | |
| 2003/0218189 A1 | 11/2003 | Christiansen et al. | |
| 2003/0219954 A1 * | 11/2003 | Baba | 438/373 |
| 2004/0009649 A1 | 1/2004 | Kub et al. | |
| 2004/0031979 A1 | 2/2004 | Lochtefeld et al. | |
| 2004/0048439 A1 | 3/2004 | Soman et al. | |
| 2004/0048447 A1 | 3/2004 | Kondo | |
| 2004/0063293 A1 | 4/2004 | Greenberg et al. | |
| 2004/0079989 A1 | 4/2004 | Kaneko et al. | |
| 2004/0087119 A1 | 5/2004 | Maa et al. | |
| 2004/0164336 A1 | 8/2004 | Weimer et al. | |
| 2004/0222486 A1 | 11/2004 | Ellis-Monaghan et al. | |
| 2004/0227158 A1 | 11/2004 | Delhougne et al. | |
| 2004/0251458 A1 | 12/2004 | Mizushima et al. | |
| 2004/0253776 A1 | 12/2004 | Hoffman et al. | |
| 2005/0045905 A1 | 3/2005 | Chu et al. | |
| 2005/0045962 A1 | 3/2005 | Iwata et al. | |
| 2005/0048745 A1 | 3/2005 | Todd | |
| 2005/0051798 A1 | 3/2005 | Lanzerotti et al. | |
| 2005/0051861 A1 | 3/2005 | Shi et al. | |
| 2005/0092235 A1 | 5/2005 | Brabant et al. | |
| 2005/0112857 A1 | 5/2005 | Gluschenkov et al. | |
| 2005/0127392 A1 | 6/2005 | Chu et al. | |
| 2005/0181555 A1 | 8/2005 | Haukka et al. | |
| 2005/0191911 A1 | 9/2005 | Greenberg et al. | |
| 2005/0230705 A1 | 10/2005 | Taylor | |
| 2005/0233534 A1 | 10/2005 | Lanzerotti et al. | |
| 2005/0250289 A1 | 11/2005 | Babcock et al. | |
| 2005/0280103 A1 | 12/2005 | Langdo et al. | |
| 2006/0011906 A1 | 1/2006 | Bedell et al. | |
| 2006/0030093 A1 | 2/2006 | Zhang et al. | |
| 2006/0068557 A1 | 3/2006 | Ochimizu et al. | |
| 2006/0121692 A1 | 6/2006 | Shiota et al. | |
| 2006/0151787 A1 | 7/2006 | Chen et al. | |
| 2006/0157733 A1 | 7/2006 | Lucovsky et al. | |
| 2006/0186510 A1 | 8/2006 | Lochtefeld et al. | |
| 2006/0231862 A1 | 10/2006 | Otsuka et al. | |
| 2006/0273392 A1 | 12/2006 | Ito et al. | |
| 2006/0284165 A1 | 12/2006 | Berger et al. | |
| 2006/0292809 A1 | 12/2006 | Enicks et al. | |
| 2007/0048992 A1 | 3/2007 | Hosokawa et al. | |
| 2007/0054460 A1 | 3/2007 | Enicks | |
| 2007/0087507 A1 | 4/2007 | Liu et al. | |
| 2007/0096142 A1 | 5/2007 | Tachibana et al. | |
| 2007/0102834 A1 | 5/2007 | Enicks et al. | |
| 2007/0105335 A1 | 5/2007 | Fitzgerald | |
| 2007/0148890 A1 | 6/2007 | Enicks et al. | |
| 2007/0262295 A1 | 11/2007 | Enicks | |
| 2007/0290193 A1 | 12/2007 | Tucker | |
| 2008/0050883 A1 | 2/2008 | Enicks | |
| 2008/0099754 A1 | 5/2008 | Enicks | |
| 2008/0099840 A1 | 5/2008 | Enicks | |
| 2008/0099882 A1 | 5/2008 | Enicks | |
| 2008/0237716 A1 | 10/2008 | Enicks et al. | |
| 2009/0258478 A1 | 10/2009 | Enicks | |

FOREIGN PATENT DOCUMENTS

| | | |
|---|---|---|
| WO | WO2007056708 A2 | 5/2007 |
| WO | WO2007056708 A3 | 5/2007 |

(56) References Cited

FOREIGN PATENT DOCUMENTS

| WO | WO2007079372 A2 | 7/2007 |
| --- | --- | --- |
| WO | WO2007079372 A3 | 7/2007 |
| WO | WO2007133949 A1 | 11/2007 |
| WO | WO2008024587 A2 | 2/2008 |
| WO | WO2008024587 A3 | 2/2008 |
| WO | WO2008054957 A1 | 5/2008 |
| WO | WO2008054967 A2 | 5/2008 |
| WO | WO2008054967 A3 | 5/2008 |
| WO | WO2008057692 A2 | 5/2008 |
| WO | WO2008057692 A3 | 5/2008 |
| WO | WO2008057695 A1 | 5/2008 |

OTHER PUBLICATIONS

Enicks, D., "Enhanced Carbon Confinement of Ultra Narrow Boron Profiles in SiGeC NBTs", IEEE Transactions on Electronic Devices, 53(8), (2006).

Enicks, D., et. al., "Thermal Redistribution of Oxygen and Carbon in Boron-Doped Psudomorphic SiGeC Heterojunction Nanometer Base Layers", Journal of Electrochemical Society, 153(6), (2006), G529-G533.

Enicks, Dwarin, "Pseudomorphic Growth of Sub-40 nm Si1-x-yGexCy by LPCVD with Enhanced Boron Confinement and Carrier Transport for Advanced NPN HBTs", White Paper from Atmel Corporation, (Aug. 2003).

Enicks, Darwin G, et. al., "Thermal Redistribution of Oxygen and Carbon in Sub-50 NM Strained Layers of Boron Doped SiGeC," ECS Transactions, vol. 3, No. 7, (2006), 1087-1098.

Gosele, U., et. al., "Chapter 7 Thinning Procedures", Science and Technology Semiconductor Water Bonding, Duke University, http://www.duke.edu/web/wbl/ch7-hpge.html#7.1, (1999).

Houghton, D.C., "Strain relaxation kinetics in Si1−xGex/Si heterostructures", J. Appl.Physics, 70(4), 1991 American Institute of Physics, Institute for Microsturctural Sciences, National Research Counsel, Canada, (Aug. 15, 1991), 2136-2151.

Kar, G.S., et. al., "Effect of carbon on lattice strain and hole mobility in Si1-xGex alloys", Journal of Materials Science: Materials in Electronics, 13(1), 2002 Kluwer Academic Publishers, U.S., (Jan. 2002), 49-55.

Kasper, et. al., "Strain Adjustment with Thin Virtual Substrates", Solid-State Electron, 48, (2004), 1257.

Kasper, et. al., Properties of Silicon Germanium and SiGe: Carbon, EMIS Datareviews Series No. 24, INSPEC, The Institute of Electron Engineers, London, United Kingdom, (2000).

Knoll, D., et. al., "Influence of the Oxygen content in SiGE on the Parameters of Si/SiGe Heterjunction Bipolar Transistors", Journal of Electronic Materials 27(9), (1998), 1022-1026.

Matthews, J.W., et. al., "Defects in Epitaxial Multilayers", Journal of Crystal Growth, 27 (1974), 118-125.

Neimash, M.V., et. al., "Oxygen Precipitation and Thermal Donor Formation in Pb and C Doped n-Type Czochraiski Silicon," Proceedings, Electrochemical Society—2004 Joint International Meetings, (Abstract 1075), (2004).

Pavesi, L., "A Review of the Various Efforts to a Silicon Laser," Optoelectronic Integration of Silicon Proceddings of SPIE, (Photonic West, San Diego, CA, (2003).

People, R., "Calculation of critical layer thickness versus attic mismatch for GexSi1-x/Si strained-layer heterostructures," Applied Physics Letters, 47(3), (1985).

Rafi, J.M. et. al., "Analysis of Oxygen Thermal Donor Formation in n-type Cz Silicon", In: Analytical and Diagnostic Techniques for Semiconductor Materials, Devices and Processes, (Electrochemical Society), (2003).

U.S. Appl. No. 11/166,287, Response Filed Jun. 30, 2008 to Non-Final Office Action mailed Apr. 3, 2008.
U.S. Appl. No. 11/166,287, Final Office Action mailed Jun. 1, 2009.
U.S. Appl. No. 11/166,287, Non-Final Office Action mailed Apr. 3, 2008.
U.S. Appl. No. 11/166,287, Non-Final Office Action mailed Nov. 4, 2008.
U.S. Appl. No. 11/166,287, Notice of Allowance mailed Oct. 8, 2009.
U.S. Appl. No. 11/166,287, Response Filed Jan. 23, 2008 to Restriction Requirement mailed Jan. 16, 2008.
U.S. Appl. No. 11/166,287, Response Filed on Feb. 3, 2009 to Non-Final Office Action mailed Nov. 4, 2008.
U.S. Appl. No. 11/166,287, Response Filed Sep. 1, 2009 to Final Office Action mailed Jun. 1, 2009.
U.S. Appl. No. 11/166,287, Restriction Requirement mailed Jan. 16, 2008.
U.S. Appl. No. 11/268,154, Amendment and Response filed Sep. 7, 2007 to Non-Final Office Action mailed on Jun. 7, 2007.
U.S. Appl. No. 11/268,154, Final Office Action mailed Jul. 13, 2010.
U.S. Appl. No. 11/268,154, Advisory Action mailed Jun. 14, 2010.
U.S. Appl. No. 11/268,154, Amendment and Response (with Affidavits) filed on Feb. 25, 2008 to Non-Final Office Action mailed on Oct. 26, 2007.
U.S. Appl. No. 11/268,154, Amendment and Response filed on May 20, 2008 to Final Office Action.
U.S. Appl. No. 11/268,154, Final Office Action mailed on Mar. 20, 2008.
U.S. Appl. No. 11/268,154Final Office Action mailed on Dec. 23, 2008.
U.S. Appl. No. 11/268,154, Non-Final Office Action mailed on Jun. 7, 2007.
U.S. Appl. No. 11/268,154, Non-Final Office Action mailed on Jun. 29, 2009.
U.S. Appl. No. 11/268,154, Non-Final Office Action mailed on Aug. 4, 2008.
U.S. Appl. No. 11/268,154, Non-Final Office Action mailed on Oct. 26, 2007.
U.S. Appl. No. 11/268,154, Non-Final Office Action mailed on Nov. 19, 2009.
U.S. Appl. No. 11/268,154, Response filed on Feb. 19, 2010 to Non-Final Office Action mailed on Nov. 19, 2009.
U.S. Appl. No. 11/268,154, Response filed on Feb. 23, 2009 to Final Office Action mailed on 12-213-2008.
U.S. Appl. No. 11/268,154, Response filed on May 26, 2009 to Final Office Action mailed on Dec. 23, 2008 and Advisory Action mailed on Apr. 10, 2009.
U.S. Appl. No. 11/268,154, Response filed on Jun. 1, 2010 to Final Office Action mailed on Apr. 1, 2010.
U.S. Appl. No. 11/268,154, Response filed on Sep. 29, 2009 to Non-Final Office Action mailed on Jun. 29, 2009.
U.S. Appl. No. 11/268,154, Response filed on Dec. 4, 2008 to Non-Final Office Action mailed on Aug. 4, 2008.
U.S. Appl. No. 11/318,797, Non-Final Office Action mailed on Aug. 19, 2008—OARN.
U.S. Appl. No. 11/318,797, Restriction Requirement mailed on May 5, 2008.
U.S. Appl. No. 11/318,797, Non-Final Office Action mailed on Aug. 19, 2008.
U.S. Appl. No. 11/318,797, Notice of Allowance mailed on Dec. 31, 2009.
U.S. Appl. No. 11/318,797, Preliminary Application and Response filed on Jun. 4, 2008 to Restriction Requirement mailed on May 15, 2008.
U.S. Appl. No. 11/318,797, Preliminary Amendment filed on Apr. 10, 2006.
U.S. Appl. No. 11/318,797, Response Filed on Nov. 19, 2008 to Non Final Office Action mailed on Aug. 19, 2008.
U.S. Appl. No. 11/318,797, Supplemental Notice of Allowability Mailed on Mar. 10, 2010.
U.S. Appl. No. 11/421,161, Non-Final Office Action mailed on Mar. 9, 2009.
U.S. Appl. No. 11/421,161, Non-Final Office Action mailed on Oct. 5, 2009.
U.S. Appl. No. 11/421,161, Response Filed on Jun. 9, 2009 to Non-Final Office Action mailed on Mar. 9, 2009.
U.S. Appl. No. 11/467,480, Notice of Allowance mailed on Jan. 12, 2010.
U.S. Appl. No. 11/467,480, Final Office Action mailed on Aug. 20, 2008.

(56) References Cited

OTHER PUBLICATIONS

U.S. Appl. No. 11/467,480, Non-Final Office Action mailed on Feb. 21, 2008.
U.S. Appl. No. 11/467,480, Notice of Allowance mailed on 03-09-20009.
U.S. Appl. No. 11/467,480, Notice of Allowance mailed on Jul. 6, 2009.
U.S. Appl. No. 11/467,480, Response Filed on Jan. 21, 2008.
U.S. Appl. No. 11/467,480, Response Filed on May 21, 2008 to Non-Final Office Action mailed on Feb. 21, 2008.
U.S. Appl. No. 11/467,480, Response Filed on Dec. 19, 2008 to Final Office Action Mailed on Aug. 20, 2008.
U.S. Appl. No. 11/467,480, Restriction Requirement Mailed on Jan. 8, 2008.
U.S. Appl. No. 11/553,313, Amendment and Response Filed on Apr. 2, 2008 to Non-Final Office Action Mailed on Jan. 2, 2008.
U.S. Appl. No. 11/553,313, Non-Final Office Action Mailed on Jan. 2, 2008.
U.S. Appl. No. 11/553,313, Notice of Allowance Mailed on Feb. 25, 2009.
U.S. Appl. No. 11/553,313, Notice of Allowance Mailed on Jun. 2, 2008.
U.S. Appl. No. 11/553,313, Notice of Allowance Mailed on Jun. 15, 2009.
U.S. Appl. No. 11/553,313, Notice of Allowance Mailed on Sep. 25, 2008.
U.S. Appl. No. 11/553,333, Amendment and Response filed on Jun. 30, 2008 to Non-Final Office Action Mailed on Apr. 3, 2008.
U.S. Appl. No. 11/553,333, Non-Final Office Action Mailed on Apr. 3, 2008.
U.S. Appl. No. 11/553,333, Notice of Allowance Mailed on Jan. 2, 2009.
U.S. Appl. No. 11/553,333, Notice of Allowance Mailed on Sep. 8, 2008.
U.S. Appl. No. 11/553,333, Response Filed on Jun. 30, 2008 to Non-Final Office Action Mailed on Apr. 3, 2008.
U.S. Appl. No. 11/554,430, Non-Final Office Action Mailed on Sep. 30, 2008.
U.S. Appl. No. 11/554,430, Notice of Allowance Mailed on Jan. 19, 2010.
U.S. Appl. No. 11/554,430, Notice of Allowance Mailed on Aug. 4, 2009.
U.S. Appl. No. 11/554,430, Response and Preliminary Amendment Filed on Apr. 11, 2008 to Restriction Requirement Mailed on Mar. 13, 2008.
U.S. Appl. No. 11/554,430, Response Filed on Dec. 30, 2008 to Non-Final Office Action Mailed on Sep. 30, 2008.
U.S. Appl. No. 11/554,430, Restriction Requirement Mailed on Mar. 13, 2008.
U.S. Appl. No. 11/554,796, Notice of Allowance Mailed on Jan. 5, 2009.
U.S. Appl. No. 11/554,796, Restriction Requirement Mailed on Aug. 7, 2008.
U.S. Appl. No. 12/114,571, Amendment and Response Filed on Feb. 5, 2009 to Non-Final Office Action Mailed on Nov. 5, 2008.
U.S. Appl. No. 12/114,571, Final Office Action Mailed on Nov. 6, 2009.
U.S. Appl. No. 12/114,571, Non-Final Office Action Mailed on Nov. 5, 2008.
U.S. Appl. No. 12/114,571, Notice of Allowance Mailed on Apr. 24, 2009.
Application Serial No. PCT/US07/68107, International Preliminary Report on Patentability Date Mailed Oct. 9, 2009.
U.S. Appl. No. 11/268,154, Final Office Action Mailed on Apr. 1, 2010.
Application Serial No. PCT/US07/68107, International Search Report Mailed on Oct. 23, 2007.
Application serial No. PCT/US07/80723, International Search Report Mailed on Mar. 6, 2008.
Application serial No. PCT/US07/80723, Written Opinion Mailed on Mar. 6, 2008.
Application serial No. PCT/US07/80994, International Search Report Mailed on May 7, 2008.
Application serial No. PCT/US07/80994, Written Opinion Mailed May 7, 2008.
Application serial No. PCT/US2006/60555, International Search Report Mailed on Apr. 29, 2008.
Application serial No. PCT/US2006/60555, Written Opinion Mailed on Apr. 29, 2008.
Application serial No. PCT/US2006/62603, International Search Report Mailed on Apr. 28, 2008.
Application serial No. PCT/US2006/62603, Written Opinion Mailed on Apr. 28, 2008.
Application serial No. PCT/US2007/068107, International Search Report Mailed on Oct. 23, 2007.
Application serial No. PCT/US2007/07432, International Search Report Mailed on Jun. 18, 2008.
Application serial No. PCT/US2007/07432, Written Opinion Mailed on Jun. 18, 2008.
Application serial No. PCT/US2007/080723, International Preliminary Report Mailed on Feb. 20, 2010.
Application serial No. PCT/US07/80772, International Search Report Mailed on Feb. 29, 2008.
Application serial No. PCT/US07/80772, Written Opinion Mailed on Feb. 29, 2008.

* cited by examiner

INTEGRATED CIRCUIT STRUCTURES CONTAINING A STRAIN-COMPENSATED COMPOUND SEMICONDUCTOR LAYER AND METHODS AND SYSTEMS RELATED THERETO

This application is a divisional of U.S. application Ser. No. 12/901,867 filed Oct. 11, 2010, which is a continuation-in-part of application Ser. No. 11/268,154, entitled, "Methods for Growing Strain-Compensated Metastable Compound Films" (as amended) filed on Nov. 7, 2005, which is incorporated herein by reference in its entirety.

TECHNICAL FIELD

The invention generally relates to methods of fabrication of integrated circuits (ICs). More specifically, the invention is a method of fabricating and integrating a metastable silicon-germanium (SiGe) base region into a heterojunction bipolar transistor (HBT).

BACKGROUND ART

The SiGe HBT has significant advantages over a silicon bipolar junction transistor (BJT) in gain, frequency response, noise parameters, and retains an ability to integrate with CMOS devices at relatively low cost. Cutoff frequencies ($F_t$) of SiGe HBT devices have been reported to exceed 300 GHz, which is favorable as compared to GaAs devices. However, GaAs devices are relatively high in cost and cannot achieve the level of integration, such as, for example, of BiCMOS devices. The silicon compatible SiGe HBT provides a low cost, high speed, low power solution that is quickly replacing other compound semiconductor devices.

Advantages of SiGe are realized by a bandgap reduction creating an energy band offset at the Si—SiGe heterojunction(s) of the HBT, thereby resulting in increased current densities for a given base-emitter bias and higher gains. Also, a lower resistivity is possible with addition of Ge to a Si lattice. The higher current densities and lower base resistance values allow improved unity gain cutoff frequencies and maximum oscillation frequencies than comparable silicon BJTs, and are comparable to other compound devices such as GaAs. However, the emitter collector breakdown voltage (especially BVCEO) is inversely proportional to the current gain ($\beta$). The structural and process changes required to enhance Ft and reduce power lead to higher and higher current gains and hence lower and lower collector-emitter breakdown voltages.

Elevated Ge fractions result in an increase in base recombination current and a reduction in current gain for a given layer thickness and doping level. This effect has been confirmed experimentally to extend beyond 30% Ge. References on defect formation in pseudomorphic SiGe with high Ge content suggests the effect will continue to increase for Ge fractions well above 40% (i.e., Kasper et al., "Properties of Silicon Germanium and SiGe:Carbon," INSPEC, 2000). Therefore, a compromise of increasing the Ge fraction high enough to reduce current gain in high-speed devices provides a way to compensate for an inevitable increase in gain and degradation of BVCEO as basewidths continue to shrink.

However, there is a limit to how much Ge can be added to the Si lattice before excess strain relaxation and gross crystalline defects occur. A critical thickness ($h_c$) of a SiGe layer that is lattice matched to the underlying silicon is a function of (1) percentage of Ge; (2) SiGe film thickness; (3) cap layer thickness; (4) temperature of HBT filmstock processing; and (5) temperature of thermal anneals following a silicon-germanium deposition. Above the critical thickness, $h_c$, the SiGe film is in a metastable and/or unstable region, which implies it will relax readily with a large enough application of thermal energy. Therefore, the degree of metastability is largely a function of percent Ge, SiGe layer thickness, cap layer thickness, and process induced strain due to thermal energy. Construction of a SiGe base of a conventional SiGe HBT described to date is that of a stable, pseudomorphic, or lattice-matched layer. Contemporaneous state-of-the-art procedures include growing stable, strained or lattice-matched alloys of SiGe with carbon to prevent spreading of the boron profile in the base region.

Metastable film growth is typically avoided due to the fact that relaxation results in lattice imperfections. These imperfections result in recombination centers; hence, a reduction in minority carrier lifetime ($\tau_b$) and an increase in base recombination current ($I_{RB}$) occurs. If not controlled, a resultant poor crystal quality due to lattice imperfections will degrade device performance. "Bridging" defects will also lead to excessive leakage current along with extremely low current gain. The film will also be very sensitive to process induced thermal stresses and therefore will not be manufacturable. Therefore, to avoid this type of degradation, the HBT designs to date result in a device with a base region that is in the stable region of film growth, which equates to a SiGe thickness that is equal to or below the critical thickness, $h_c$.

Properties of metastable SiGe are discussed in several papers such as D. C. Houghton, "Strain Relaxation Kinetics in Si1-xGex/Si Heterostructures," *Journal of Applied Physics*, Vol. 70, pp. 2136-2151 (Aug. 15, 1991), and G. S. Kar et al. "Effect of carbon on lattice strain and hole mobility in $Si_{1-x}Ge_x$ alloys," Dept, of Physics and Meteorology, Indian institute of Technology, Kharagpur 721302, India, *Journal of Materials Science: Materials in Electronics*, Vol. 13, pp. 49-55 (2002). Further, U.S. Pat. No. 6,586,297 ("the '297 patent") and U.S. Pat. No. 6,781,214 ("the '214 patent"), to U'Ren et al. describe a "Metastable Base in a High-Performance HBT" and a "Method for Integrating a Metastable Base into a High Performance HBT and Related Structure," respectively.

The '297 patent describes a heterojunction bipolar transistor that includes a metastable epitaxial silicon-germanium base on a single crystal collector and an emitter situated over a metastable epitaxial SiGe base.

The metastable epitaxial SiGe base is grown in an epitaxial reactor where the metastable epitaxial SiGe base is a strained crystalline structure including a conductivity altering dopant incorporated in-situ during film growth; the dopant is added for the sole purpose of establishing a specific conductivity type. The '297 patent describes a method that includes a short thermal anneal at temperatures of 900° C. to 950° C. to avoid relaxing the metastable SiGe film layer.

The '214 patent describes a heterojunction bipolar transistor fabricated by forming a metastable epitaxial SiGe base on a collector with a concentration of germanium greater than 20 atomic percent. An emitter is then fabricated over the metastable epitaxial SiGe base. The emitter is doped with an n- or p-type impurity depending on the transistor type, npn or pnp. The HBT is then heated in a spike anneal process to maintain the metastable epitaxial silicon-germanium base as a strained crystalline structure and to diffuse the dopants to form the emitter-base junction. The metastable epitaxial SiGe base is grown in an epitaxial reactor where the metastable epitaxial SiGe base is strained crystalline structure including a dopant incorporated in-situ during film growth; the dopant is added for the sole purpose of establishing a specific conductivity type. The '214 patent describes a method that includes a short thermal anneal at temperatures of 900° C. to 950° C. to avoid relaxing the metastable SiGe film layer.

However, the methods described in these afore-mentioned references for forming a metastable SiGe film are still very susceptible to adverse effects of thermal stress such as slip dislocations and threading dislocations; all of which are associated with film relaxation. In highly metastable films, relaxation can take place during extremely short time intervals during an anneal process, depending on the degree of metastability, such as the first fraction of a second during a short anneal and/or a flash anneal process.

Therefore, what is needed is a method to grow and integrate strain-compensated metastable SiGe layers for application to a SiGe HBT. Such a method should allow a skilled artisan to, for example, control and utilize defect density for device optimization, achieve extremely high energy band offsets and grades ($\Delta E_G(0)$ & $\Delta E_G(\text{grade})$) without incurring excess "bridging" defects, such as slip or threading dislocations, and provide a method to achieve high volume manufacturability of films that would normally be unreliable and/or unrepeatable due to their extremely metastable or even unstable properties.

Each of these improvements allows the use of films that would otherwise be highly metastable (or even unstable) films in order to realize the advantages offered with high concentrations of Ge.

SUMMARY

The present invention is a method for pseudomorphic growth and integration of a strain-compensated metastable and/or unstable compound base, which may also be in-situ doped, into an electronic device, such as, for example, a SiGe NPN HBT, by substitutional and/or interstitial placement of strain-compensating atomic species. The method allows for control of defect density, and thus resultant control of minority carrier lifetime, base recombination current, base current and current gain, and breakdown. Additionally, the ability to achieve greater Ge fractions than is possible without strain compensation and maintain a strained, lattice matched film enables devices with greater energy band offsets and hence greatly improved current densities and hence significantly improved $F_t$ and $F_{max}$ figures.

The invention also applies to strained layers in a variety of other electronic device types including strained SiGe, strained Ge, and/or strained Si in MOS applications, vertical thin film transistors (VTFT), resonant tunnel diodes (RTD), and a variety of other electronic device types. Heterojunction and heterostructure devices formed from compound semiconductors other than SiGe, such as, for example, GaAs, InP, and AlGaAs may also be amenable to beneficial processes described herein. Any strain-compensating element that will incorporate substitutionally and/or interstitially are amendable to the methods presented herein.

Elements that do not significantly affect the conductivity are oftentimes desirable. Therefore, when using strain compensating group IV semiconductors such as Si, Ge, and/or SiGe it might be desirable to avoid group II/III or group V/VI elements to avoid affecting the conductivity. However, this does not preclude the use of "conductivity altering" elements for the dual purpose of strain compensation and also to effectively alter the conductivity simultaneously.

An electronic device fabricated by the method described herein, in an exemplary embodiment, includes a substrate with a compound semiconductor film disposed over a first surface of the substrate. The compound semiconductor film is deposited in a metastable state by exceeding the critical thickness, hc, for the germanium concentration being used and the thermal cycles employed in the process after the compound semiconductor film has been formed. A substitutional strain-compensating atomic species (e.g., carbon) is added in-situ during the film growth to control defect density and avoid complete relaxation during the remainder of processing.

DETAILED DESCRIPTION

A strain-compensating atomic species is a species that, when added, alters the lattice parameter of a crystalline film from its intrinsic value. The intrinsic lattice parameter is the lattice parameter of the film or layer without the strain compensating species. For strain compensation of SiGe, one strain-compensating atomic species is carbon. One atomic percent of substitutional carbon will compensate eight percent to ten percent of Ge. Additionally, carbon can be substitutionally placed to approximately 2.5 percent in SiGe, or enough carbon to strain compensate 20 to 25 percent of Ge. Therefore, pseudomorphic strain-compensated metastable and/or unstable films with Ge levels of greater than 40 percent are possible (i.e., using four percent to five percent carbon) for electronic device use.

Even though one exemplary embodiment provides for strain reduction, a strain compensating atomic species with a larger lattice constant than either Si or Ge could be added to purposely increase strain. This type of strain modification would be suitable as well, for instance as a tool for bandgap and/or lattice engineering; defect engineering could make good use of strain modification as well. Strain modification would also be useful for enhancing carrier mobility in a "strain-compensated film" and any adjacent film layers.

The method described herein differs from previous methods for formation of a SiGe HBT due to an emphasis on intentional growth of a metastable and/or unstable base layer and a calculated incorporation of substitutional and/or interstitial carbon. The substitutional and/or interstitial carbon strain compensates an HBT base region to avoid strain relaxation, and allows defectivity engineering to decouple current gain from IC and $F_t$ enhancement, along with integrating downstream thermal anneal processes thus avoiding excess carbon diffusion and maintaining the film in a strained state.

Figure 1:
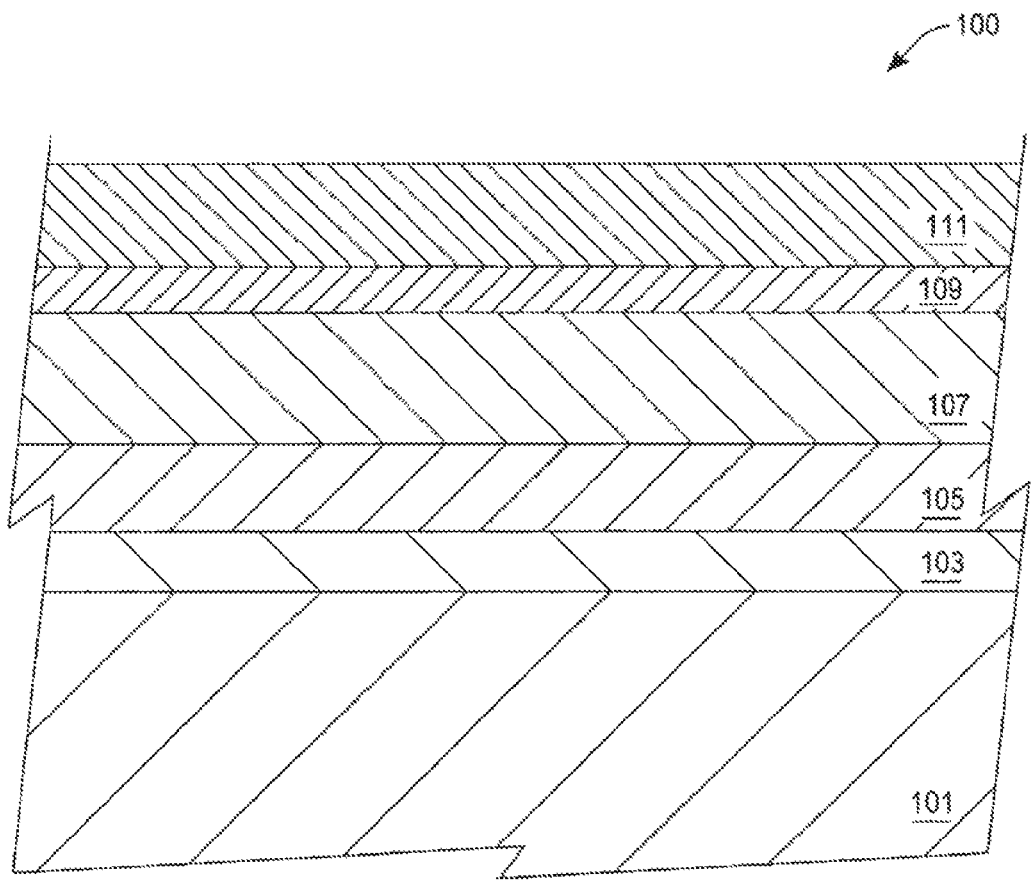
FIG. 1 is an exemplary cross-section of a film stack used in forming a portion of an HBT in accordance with the present invention.

With reference to FIG. 1, an exemplary film stack 100 used in forming a strain-compensated metastable layer of an HBT includes a substrate 101, an epitaxial layer 103, an elemental seed layer 105, a strain-compensated metastable SiGe base region 107, an elemental cap layer 109, and a polysilicon emitter layer 111. One skilled in the art will recognize that other materials may be employed for the emitter layer 111 such as, for example, polySiGe.

In a specific exemplary embodiment, the substrate 101 is a p-type, 20 Ω-cm <100> silicon wafer. The epitaxial layer 103 is grown by LPCVD and can be either p-type or n-type depending on the technology application and the requirements for breakdown voltages and collector resistance.

Arsenic and/or phosphorous may be doped into the epitaxial layer 103 and the substrate 101 to provide a low resistance collector region. The arsenic and phosphorous may be diffused or implanted. If implanted, one skilled in the art will recognize that the energy and dose of the implant must be determined by specific technology requirements for collector resistance, breakdown voltages, etc. A skilled artisan will also recognize that other methods may be employed to dope this region, such as diffusion or LPCVD (in-situ doping).

In the case of a silicon substrate 101, prior to growth, the silicon growth surface should be cleaned (typically with a wet chemistry such as hydrofluoric acid) to remove any native oxidation and surface contaminants. The elemental seedlayer 105, the metastable base region 107, and the elemental cap layer 109 may be fabricated during the same LPCVD process. Temperatures in the range of 500° C. to 900° C. are typically employed for epitaxial growth of each layer. Silane ($SiH_4$) and germane ($GeH_4$) are typical gases for silicon and SiGe deposition. Diborane ($B_2H_6$) and arsine ($AsH_3$) are common p- and n-type dopant sources. Hydrogen ($H_2$) may be utilized as a carrier gas, however other gases such as helium may be used.

In another specific exemplary embodiment, the substrate 101 is a <100> p-type silicon wafer, boron doped to a concentration of approximately $10^{15}$ atoms/cm. Alternatively, the substrate 101 could also be, for example, an n-type silicon wafer or a substrate comprised of a compound semiconducting material such as silicon-germanium of either p-type or n-type conductivity. The substrate 101 may also be silicon-on-insulator (SOI) or silicon germanium-on-insulator. The epitaxial layer 103 is deposited to a thickness of between 0.3/m and 2/m, followed by the elemental seed layer 105. The epi layer is typically added as a low doped region to tailor breakdown voltages and/or collector resistance.

In this embodiment, the elemental seed layer 105 is comprised of silicon, which is epitaxially grown to a thickness range of 10 nm to 100 nm, although other semiconducting materials may be employed, such as silicon germanium with very low Ge content. The strain-compensated metastable SiGe layer 107 is deposited to a thickness greater than the critical thickness, $h_c$, followed by the elemental cap layer 109 comprised of, for example, silicon.

The critical thickness, $h_c$, is determined based on atomic percentage of Ge within an upper and lower bound of a metastable region. This critical thickness determination is based on historical work of People/Bean and Matthews/Blakeslee, and is known in to one of skill in art.

Figure 2:
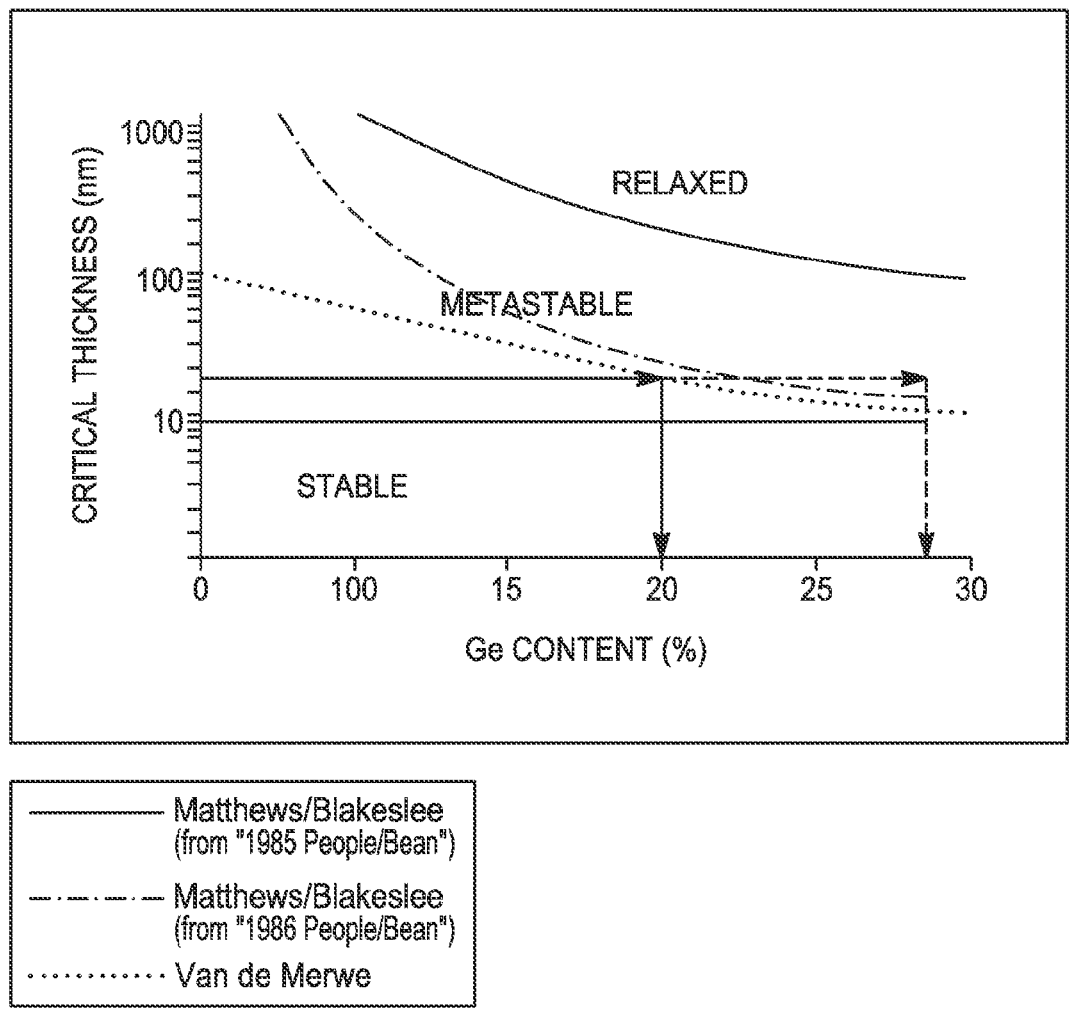
FIG. 2 is a curve depicting critical thickness as a function of Ge content.

As an example, FIG. 2 shows that for a film with 20% Ge, the critical thickness, $h_c$, according to the Van de Merwe curve (shown in *The calculation of critical layer thickness versus lattice mismatch for GexSi1-x/Si strained-layer heterostructures*," R. People and J. C. Bean, Appl. Phys. Lett., Vol. 47, No. 3, p. 322, 1 Jul. 1985 (hereinafter "1985 People/Bean") and *Erratum: The calculation of critical layer thickness versus lattice mismatch for GexSi1-x/Si strained-layer heterostructures*," R. People and J. C. Bean, Appl. Phys. Lett., Vol. 49, No. 4, p. 229, 28 Jul. 1986 (hereinafter 1986 People/Bean")), a portion of which is reproduced in FIG. 2, is defined by the bottom edge of the metastable region is approximately 20 nm, while a film with 28% Ge has an $h_c$ of only 9 nm. Therefore, to grow a fully "strain compensated" film with 28% Ge that is also 20 nm thick, carbon may be added to reduce the lattice parameter and strain compensate 8% of Ge. The addition of 1% of carbon throughout the SiGe lattice of a 20 nm, 28% Ge film will reduce the strain to a level that approximates that of a 20 nm, 20% Ge film. However, one skilled in the art will recognize that it might be technologically desirable to provide only enough carbon to partially strain compensate, for example, adding 0.5% carbon for purposes of defect engineering. Alternatively, 2% carbon may be added for purposes of adding thermal processing robustness.

FIG. 2 also shows a portion of the Matthews, Blakeslee curve from "1985 People/Bean" and a portion of the corrected Matthews/Blakeslee curve from "1986 People/Bean."

Additionally, one may desire to grow a film that resides well into the metastable region, and then to only partially compensate the film so-as to maintain a certain degree of metastability for defect and/or lattice engineering.

Figure 3:
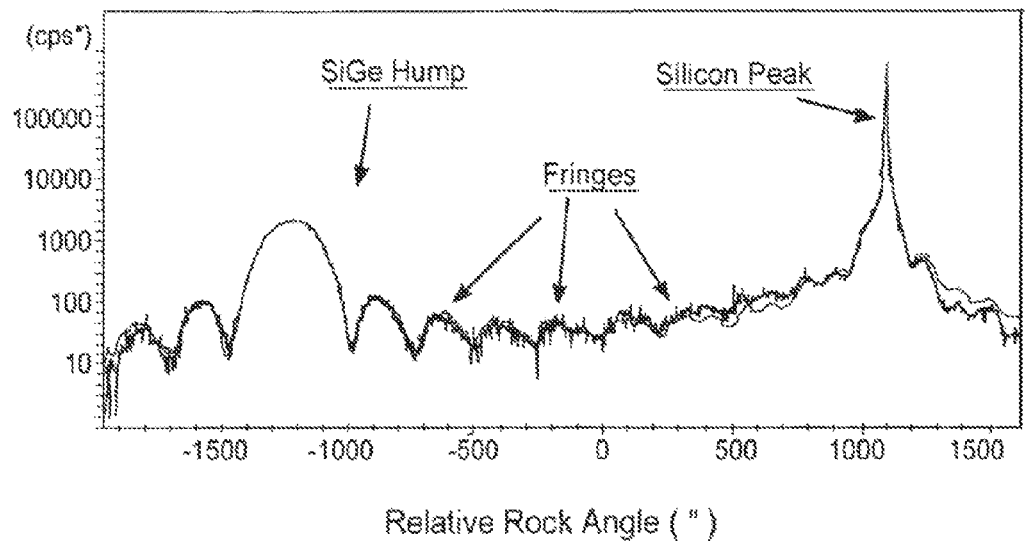
FIG. 3 is an Xrd rocking curve of a strained, lattice-matched metastable SiGe film.

One skilled in the art will recognize that data and charts such as those of FIG. 2 are meant to provide approximations, but that other means, such as Xrd rocking curves are necessary to assist in determining where an optimum degree of metastability resides for a certain film structure and/or device. With reference to FIG. 3, one skilled in the art will know that distinct "fringe rings" between the silicon peak and the "SiGe hump" are indicative of lattice matched or strained layer.

Figure 4:
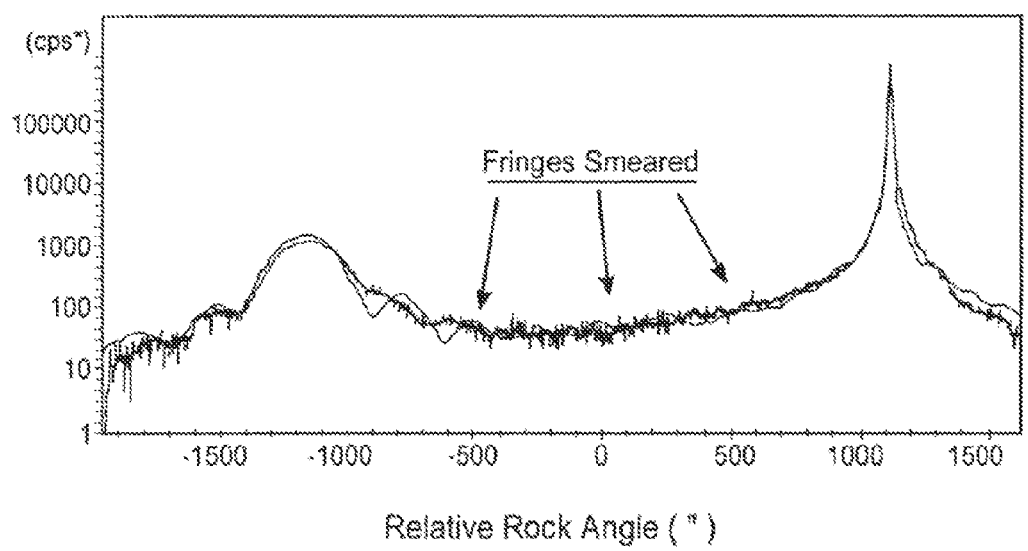
FIG. 4 is the Xrd rocking curve of FIG. 3 after a thermal anneal.

The absence of and/or "smearing" of fringes in the Xrd rocking curves will indicate a film relaxation (FIG. 4) following a thermal anneal cycle. One skilled in the art will also know that Xrd rocking curves assessed following film growth and also following the downstream thermal treatments will provide information necessary for tailoring of the strain compensation process and/or thermal processes to avoid complete strain or lattice relaxation.

Other experimental approaches may be utilized, such as putting electrical devices through electrical testing to identify the acceptable level of strain compensation for a particular device or technology. This acceptable level will be determined by device electrical parameters, especially the collector current, base current, current gain, and breakdown voltages for an HBT. Other electrical parameters may be characterized and controlled for other device types and/or technologies.

Individual processes should be characterized with experimental methods to determine where their process resides with respect to the stable/metastable/relaxed regions as depicted by theoretical and empirically derived charts such as those discussed supra. This characterization will require analysis by such means of Xrd rocking curves, device electrical tests, and SIMS (secondary ion mass spectrometry) to reveal dopant diffusion, especially of strain compensating species such as carbon.

Even without the charts, the Xrd rocking curves can provide the quantitative and qualitative data necessary for developing strain compensated films, and that the "rule of thumb" for 1% carbon to compensate 8% to 10% Ge is a generally accepted guideline. Some metastable and/or unstable films and/or devices might require more or less carbon, depending on such factors as the film geometry, thermal stresses, and physically induced stresses (from adjacent films and structures) not accounted for in contemporary theoretical and empirical bodies of knowledge. Therefore, the guidelines provided herein will facilitate a development of metastable "strain compensated" films and/or devices and are intended as a system for providing an improved process and device. The guidelines also provide greater degrees of design engineering flexibility for bandgap engineering (i.e. $J_c$, $F_t$, $F_{max}$) and defectivity and/or lattice engineering (i.e., minority carrier lifetime engineering, base recombination current engineering, base current engineering, current gain engineering, and breakdown optimization).

With further reference to FIG. 1, the polysilicon emitter layer 111, in this exemplary embodiment, is comprised of n-type polysilicon that may be deposited to a thickness between 0.05 µm and 0.30 µm. However, other films such as polySiGe may also be employed.

A carbon precursor (for example, methane ($CH_4$) or acetylene $C_2H_2$) is utilized during growth of the strain-compensated metastable SiGe layer 107 to add carbon. Precursors for formation of the strain-compensated metastable SiGe layer 107 include, for example, methyl silane ($CH_3SiH_3$), silane ($SiH_4$), and germane ($GeH_4$) for the carbon, silicon, and germanium components respectively. Hydrogen ($H_2$) is typically employed as a carrier gas for all layer depositions. In-situ doping with a conductivity altering dopant of a thin section near the center of the strain-compensated metastable SiGe layer 107 creates a p-type neutral base region. This neutral base region is sandwiched between two SiGe setback or spacer layers (not shown). The p-type impurity may be boron, commonly supplied with a diborane ($B_2H_6$) precursor. The elemental cap layer 109 is epitaxially grown on top of the strain-compensated metastable SiGe layer 107. The elemental cap layer 109 (silicon) maintains the SiGe layer in a strained state. Cap layers are typically grown with a thickness between 0.05 µm and 0.1 µm. A skilled artisan will recognize that the cap layer maintains strain equilibrium within the SiGe layer, and that the thickness is tailored as appropriate.

A profile of the Ge associated with the strain-compensated metastable SiGe layer 107 is generally that of a trapezoid, although a skilled artisan will recognize that other Ge profiles, such as triangular, box, or profiles with curvature are possible. The polysilicon emitter layer 111 may be, for example, n-type in-situ doped polysilicon. Arsine ($ASH_3$) may be used as an n-type dopant precursor employing hydrogen as a carrier gas for the process. The emitter layer 111 may be monocrystalline, polycrystalline, amorphous, or a compound material of a mono, poly, or amorphous construction. In a specific exemplary embodiment, a SiGe deposition temperature is in the range of 550° C. to 650° C., although temperatures less than 600° C. may be preferred for many advanced fabrication processes in general, with a processing pressure range of 1 torr to 100 torr. Pseudomorphic SiGe growth is possible at higher temperatures, such as up to or even exceeding 900° C.

Although the present invention is described in terms of exemplary embodiments, a skilled artisan will realize that techniques described herein can readily be adapted to other forms of fabrication techniques and devices. For example, the strain-compensation techniques could be applied to other technologies such as FinFET, surround gate FET, vertical thin film transistors (VTFT), hyper-abrupt junctions, resonant tunnel diodes (RTD), and optical waveguides for photonics. Therefore, profiles, thicknesses, and concentrations of the strain-compensated metastable SiGe layer 107 can be selected to accommodate a variety of needs. The metastable SiGe layer 107 could also be strain compensated with other elements, which may induce a diminished diffusivity for a given dopant type.

Also, although process steps and techniques are described in detail, a skilled artisan will recognize that other techniques and methods may be utilized, which are still included within a scope of the appended claims. For example, there are several techniques used for depositing and doping a film layer (e.g., chemical vapor deposition, plasma-enhanced chemical vapor deposition, molecular beam epitaxy, atomic layer deposition, etc.). Although not all techniques are amenable to all film types described herein, one skilled in the art will recognize that multiple and alternative methods may be utilized for depositing or otherwise forming a given layer and/or film type. Additionally, many industries allied with the semiconductor industry could make use of the strain-compensation technique. For example, a thin-film head (TFH) process in the data storage industry, an active matrix liquid crystal display (AMLCD) in the flat panel display industry, or the microelectromechanical industry (MEM) could readily make use of the processes and techniques described herein. The term "semiconductor" should thus be recognized as including the aforementioned and related industries. The drawing and specification are, accordingly, to be regarded in an illustrative rather than a restrictive sense.

What is claimed is:

1. A method comprising:
    growing a compound semiconductor layer on a substrate with a first thickness such that the compound semiconductor layer is in a metastable state, wherein the metastable state is obtained by setting the first thickness to exceed a critical thickness of an elemental concentration associated with a first element included in the compound semiconductor;
    determining an amount by which the elemental concentration of the first element exceeds a base concentration of the first element corresponding to a stable state of the compound semiconductor layer at the first thickness;
    determining a concentration of a strain-compensating atomic species that is configured to strain compensate, at the first thickness, the amount by which the elemental concentration of the first element exceeds the base concentration of the first element; and
    adding the strain-compensating atomic species to the compound semiconductor layer during growth of the compound semiconductor layer, at the determined concentration to maintain the compound semiconductor layer in a strained state at the first thickness.

2. The method of claim 1, wherein the compound semiconductor layer includes a silicon-germanium (SiGe) layer, and wherein the elemental concentration includes a germanium (Ge) concentration.

3. The method of claim 2, wherein growing the compound semiconductor layer in a metastable state on the substrate comprises:
    growing the silicon-germanium layer having a thickness in an order of 20 nano-meters with a concentration of germanium in the silicon-germanium layer in an order of 28%.

4. The method of claim 3, wherein adding the strain-compensating atomic species comprises:
    adding the strain-compensating atomic species at an atomic species concentration in an order of 1%.

5. The method of claim 3, wherein a ratio of the concentration of the atomic species and the concentration of germanium ranges from 1:8 to 1:10.

6. The method of claim 3, wherein growing the silicon-germanium layer comprises one of:
    applying a deposition temperature that is in a range of 550° C. to 650° C., or
    applying a deposition temperature that is less than 600° C. with a processing pressure range of 1 torr to 100 torr.

7. The method of claim 2, wherein the strain-compensating atomic species is an interstitial strain-compensating atomic species, a substitutional strain-compensating atomic species, or a combination thereof.

8. The method of claim 7, wherein the substitutional strain-compensating atomic species is carbon (C).

9. The method of claim 8, wherein forming the silicon-germanium layer comprises:
    utilizing a methyl-silane ($CH_3SiH_3$) precursor for addition of the carbon;
    utilizing silane ($SiH_4$) precursor for addition of silicon; and utilizing germane (GeH$_4$) precursor for addition of germanium, wherein hydrogen is employed as a carrier gas for all layer depositions.

10. The method of claim 7, wherein the strain-compensating atomic species is a conductivity altering element.

11. The method of claim 7, wherein the substitutional strain-compensating atomic species is a p-type impurity added near a center of the compound semiconductor layer to create a p-type neutral base region, the compound semiconductor layer forming a strain-compensated metastable layer.

12. The method of claim 1, wherein the compound semiconductor layer is one of gallium-arsenide (GaAs), indium-phosphide (InP), or aluminum-gallium-arsenide (AlGaAs).

13. The method of claim 1, wherein the strained state is a partially-strained state.

14. The method of claim 13, comprising:
prior to growing the compound semiconductor layer, forming an epitaxial layer on the substrate;
forming an elemental seed layer on the epitaxial layer; and
after growing the compound semiconductor layer, forming an elemental cap layer on top of the compound semiconductor layer, wherein the compound semiconductor layer is located between the elemental seed layer and the elemental cap layer.

15. The method of claim 14, wherein the substrate includes a silicon (Si) substrate and wherein one or more of the epitaxial layer, the elemental seed layer, the compound semiconductor layer and the elemental cap layer are formed using an LPCVD process employing temperatures in a range between 500° C. and 900° C.

16. The method of claim 14, wherein the substrate includes a <100> p-type silicon wafer, and wherein the substrate is boron-doped to a concentration in an order of $10^{15}$ atoms/cm$^3$.

17. The method of claim 14, comprising:
forming a polysilicon emitter layer on top of the elemental cap layer, wherein the elemental cap layer has an elemental cap layer thickness that is configured to maintain strain equilibrium within the compound semiconductor layer.

18. The method of claim 17, wherein the polysilicon emitter layer includes one of polysilicon-germanium or n-type polysilicon deposited to a thickness between 0.05 μm and 0.30 μm, and wherein the elemental cap layer thickness is in a range between 0.05 μm and 0.1 μm.

19. The method of claim 1, comprising applying the compound semiconductor layer for manufacturing an electronic device, wherein the electronic device is one of a heterojunction bipolar transistor (HBT), metal-oxide-semiconductor (MOS), vertical thin layer transistor (VTFT), or resonant tunnel diode (RTD).

20. The method of claim 1, wherein determining the concentration of a strain-compensating atomic species comprises:
determining, using Xrd rocking curves, a degree of metastability for the compound semiconductor layer; and
analyzing, using Xrd rocking curves, dopant diffusion corresponding to the strain-compensating atomic species.

* * * * *

UNITED STATES PATENT AND TRADEMARK OFFICE
CERTIFICATE OF CORRECTION

PATENT NO. : 9,012,308 B2
APPLICATION NO. : 14/016673
DATED : April 21, 2015
INVENTOR(S) : Darwin Gene Enicks, John Chaffee and Damian A. Carver It is certified that error appears in the above-identified patent and that said Letters Patent is hereby corrected as shown below:

Title Page, References Cited

Page 3, Column 1 (Other Publications) Line 16 – Delete "Semidconductor" and insert --Semiconductor--, therefor.

Page 3, Column 1 (Other Publications) Line 21 – Delete "Counsel," and insert --Council,--, therefor.

Page 3, Column 1 (Other Publications) Line 32 – Delete "Heterjunction" and insert --Heterojunction--, therefor.

Page 3, Column 1 (Other Publications) Line 37 – Delete "Czochraiski" and insert --Czochralski--, therefor.

Page 3, Column 1 (Other Publications) Line 41 – Delete "Proceddings" and insert --Proceedings--, therefor.

In the Specification

Column 1 Line 46 Delete "Ft" and insert --$F_t$--, therefor.

Column 1 Line 66 Delete "filmstock" and insert --filmstack--, therefor.

Column 2 Line 32 Delete "Dept," and insert --Dept.--, therefor.

Column 2 Line 33 Delete "institute" and insert --Institute--, therefor.

Column 4 Line 1 Delete "hc," and insert --$h_c$--, therefor.

Column 5 Line 25 Delete "atoms/cm." and insert --atoms/$cm^3$--, therefor.

Column 6 Line 5 Delete "Matthews, Blakeslee" and insert --Matthews/Blakeslee--, therefor.

Column 7 Line 4 Delete "C$_2$H$_2$)" and insert --($C_2H_2$)--, therefor.

Signed and Sealed this
Eighth Day of September, 2015

Michelle K. Lee
*Director of the United States Patent and Trademark Office*